(12) United States Patent
Fukui et al.

(10) Patent No.: US 10,825,955 B2
(45) Date of Patent: Nov. 3, 2020

(54) METHOD FOR MANUFACTURING LIGHT-EMITTING ELEMENT

(71) Applicant: NICHIA CORPORATION, Anan (JP)

(72) Inventors: Yoshinori Fukui, Tokushima (JP);
Yoshiki Matsushita, Tokushima (JP);
Akinori Kishi, Tokushima (JP);
Takaaki Oguri, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/362,481

(22) Filed: Mar. 22, 2019

(65) Prior Publication Data

US 2019/0296192 A1  Sep. 26, 2019

(30) Foreign Application Priority Data

Mar. 26, 2018  (JP) .................. 2018-059003

(51) Int. Cl.
| | | |
|---|---|---|
| *H01L 33/38* | (2010.01) | |
| *H01L 33/40* | (2010.01) | |
| *H01L 33/62* | (2010.01) | |

(52) U.S. Cl.
CPC .............. *H01L 33/38* (2013.01); *H01L 33/40* (2013.01); *H01L 33/62* (2013.01); *H01L 2933/0016* (2013.01); *H01L 2933/0033* (2013.01)

(58) Field of Classification Search
None
See application file for complete search history.

(56) References Cited

U.S. PATENT DOCUMENTS

| | | | |
|---|---|---|---|
| 2014/0110738 A1 | 4/2014 | Yokobayashi et al. | |
| 2015/0228862 A1 | 8/2015 | Miyoshi et al. | |
| 2016/0064603 A1 | 3/2016 | Lin et al. | |
| 2016/0315225 A1 | 10/2016 | Kageyama | |
| 2017/0194531 A1* | 7/2017 | Huang | .............. H01L 33/38 |
| 2018/0309027 A1* | 10/2018 | Pfeuffer | ............ H01L 33/382 |

FOREIGN PATENT DOCUMENTS

| | | |
|---|---|---|
| JP | 2014-060294 A | 4/2014 |
| JP | 2014-086574 A | 5/2014 |
| JP | 2016-046511 A | 4/2016 |
| JP | 2016-208012 A | 12/2016 |
| JP | 2017-069282 A | 4/2017 |

* cited by examiner

*Primary Examiner* — Robert K Carpenter
(74) *Attorney, Agent, or Firm* — Foley & Lardner LLP

(57) ABSTRACT

A method for manufacturing a light-emitting element includes: a preparation process including preparing a semiconductor stacked body that includes a first semiconductor layer, a second semiconductor layer, and a light-emitting layer, the first semiconductor layer including a semiconductor of a first conductivity type, the second semiconductor layer including a semiconductor of a second conductivity type; a first layer formation process including forming a first layer on the first semiconductor layer, the first layer being made of an insulating material; a removal process including removing a portion of the first semiconductor layer and a portion of the first layer; a processing process including introducing oxygen into a portion of the first semiconductor layer that includes a first surface formed in the removal process, the introducing being performed by, after the removal process, processing the semiconductor stacked body in an atmosphere including oxygen.

18 Claims, 3 Drawing Sheets

US 10,825,955 B2

METHOD FOR MANUFACTURING LIGHT-EMITTING ELEMENT

CROSS-REFERENCE TO RELATED APPLICATIONS

This application is based upon and claims priority to Japanese Patent Application No. 2018-059003, filed on Mar. 26, 2018, the entire contents of which are incorporated herein by reference.

FIELD

Embodiments described herein relate generally to a method for manufacturing a light-emitting element.

BACKGROUND

Stable characteristics of a light-emitting element are desirable.

SUMMARY

According to one embodiment, a method for manufacturing a light-emitting element includes a preparation process of preparing a semiconductor stacked body, the semiconductor stacked body including a first semiconductor layer, a second semiconductor layer, and a light-emitting layer provided between the first semiconductor layer and the second semiconductor layer, the first semiconductor layer including a semiconductor of a first conductivity type, the second semiconductor layer including a semiconductor of a second conductivity type; a first layer formation process of forming a first layer at the first semiconductor layer, the first layer being made of an insulating material; a removal process of removing a portion of the first semiconductor layer and a portion of the first layer; a processing process of introducing oxygen into a portion of the first semiconductor layer including a first surface formed in the removal process, the introducing being performed by processing the semiconductor stacked body in an atmosphere including oxygen after the removal process.

DETAILED DESCRIPTION

Figure 1A:
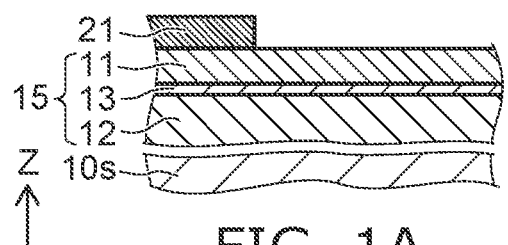
FIG. 1A is a schematic cross-sectional view illustrating a method for manufacturing a light-emitting element according to an embodiment.

Various embodiments are described below with reference to the accompanying drawings.

The drawings are schematic and conceptual, and the relationships between the thickness and width of portions, the proportions of size among portions, etc., are not necessarily the same as the actual values. The dimensions and proportions may be illustrated differently among drawings, even for identical portions.

In the specification and drawings, components similar to those described previously or illustrated in a previous drawing are marked with like reference numerals, and a detailed description thereof is omitted as appropriate.

First Embodiment

FIG. 1A to FIG. 1D and FIG. 2A to FIG. 2D are schematic cross-sectional views illustrating a method for manufacturing a light-emitting element according to an embodiment.

A semiconductor stacked body 15 is prepared as shown in FIG. 1A (a preparation process). The semiconductor stacked body 15 includes a first semiconductor layer 11, a light-emitting layer 13, and a second semiconductor layer 12. The first semiconductor layer 11 is of a first conductivity type. The second semiconductor layer 12 is of a second conductivity type. The first conductivity type is one of a p-type or an n-type. The second conductivity type is the other of the p-type or the n-type. Below, the first conductivity type is taken to be the p-type, and the second conductivity type is taken to be the n-type. The direction from the second semiconductor layer 12 toward the first semiconductor layer 11 is taken as a Z-axis direction.

The light-emitting layer 13 is provided between the first semiconductor layer 11 and the second semiconductor layer 12. A base body 10s is provided in the example. The base body 10s is, for example, a substrate. In one example, the substrate is a sapphire substrate. The second semiconductor layer 12 is provided between the base body 10s and the first semiconductor layer 11.

A first electrode 21 is provided in the example. The first semiconductor layer 11 is provided between the first electrode 21 and the second semiconductor layer 12 in the Z-axis direction. For example, a portion of the first semiconductor layer 11 does not overlap the first electrode 21.

Figure 1B:
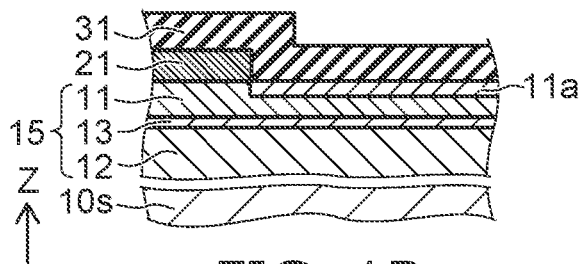
FIG. 1B is a schematic cross-sectional view illustrating a method for manufacturing a light-emitting element according to an embodiment.

As shown in FIG. 1B, a first layer 31 is formed on the first semiconductor layer 11 (a first layer formation process). For example, the first layer 31 is made of an insulating material. In the example, the first layer 31 is formed on the first electrode 21 and on a portion of the first semiconductor layer 11 (a portion not overlapping the first electrode 21).

Figure 1C:
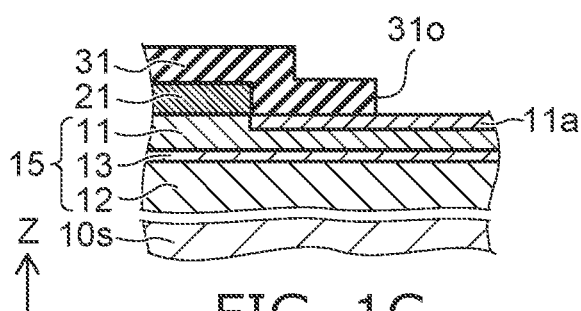
FIG. 1C is a schematic cross-sectional view illustrating a method for manufacturing a light-emitting element according to an embodiment.

As shown in FIG. 1C, a portion of the first layer 31 is removed. For example, the portion of the first layer 31 is removed by etching using a mask. A first opening 310 is formed in the first layer 31. A portion of the first semiconductor layer 11 is exposed in the first opening 31o.

Figure 1D:
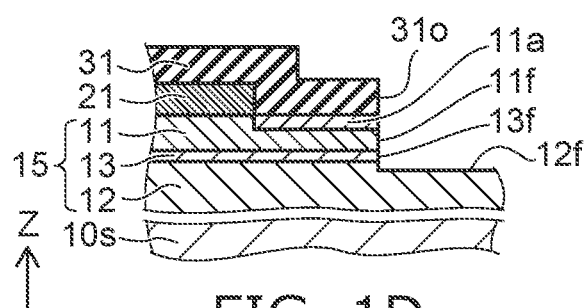
FIG. 1D is a schematic cross-sectional view illustrating a method for manufacturing a light-emitting element according to an embodiment.

Further, as shown in FIG. 1D, a portion of the semiconductor stacked body 15 is removed. The removal of the portion of the first layer 31 and the removal of the portion of the semiconductor stacked body 15 may be performed collectively.

The removal of the portion of the semiconductor stacked body 15 includes at least the removal of the portion of the first semiconductor layer 11. Thus, in the processes shown in FIG. 1C and FIG. 1D, a portion of the first semiconductor layer 11 and a portion of the first layer 31 are removed (a removal process).

In the example, a portion of the light-emitting layer 13 and a portion of the second semiconductor layer 12 are further removed in the removal process. Thus, in the embodiment, the removal process may further include removing a portion of the light-emitting layer 13 and a portion of the second semiconductor layer 12 in addition to the removal of the portion of the first semiconductor layer 11.

As shown in FIG. 1D, a first surface $11f$ of the first semiconductor layer is newly formed by the removal process. In the case where a portion of the second semiconductor layer 12 is removed in the removal process, a second surface $12f$ of the second semiconductor layer 12 is newly formed by the removal process. In the case where a portion of the light-emitting layer 13 is removed in the removal process, a third surface $13f$ of the light-emitting layer 13 is newly formed by the removal process.

Figure 2A:
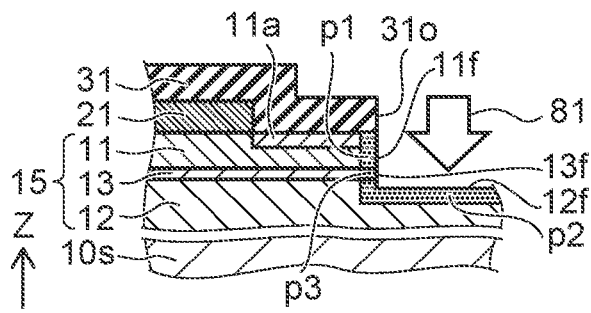
FIG. 2A is a schematic cross-sectional view illustrating a method for manufacturing a light-emitting element according to an embodiment.

As shown in FIG. 2A, the semiconductor stacked body 15 is processed in an atmosphere 81 including oxygen after the removal process (a processing process). The atmosphere 81 that includes oxygen also includes, for example, oxygen plasma. Thereby, oxygen is introduced to a first portion p1 of the first semiconductor layer 11 including the first surface $11f$. In the processing process of the example, the second surface $12f$ and the third surface $13f$ also are processed in the atmosphere 81 including oxygen, and oxygen is introduced to the portions including these surfaces. Thus, the processing process may further include introducing oxygen to the portion of the second semiconductor layer 12 including the second surface $12f$ and the portion of the light-emitting layer 13 including the third surface $13f$.

Thus, in the embodiment, oxygen is introduced to the first to third portions p1 to p3. Thereby, for example, the resistance of the first portion p1 is higher than the resistance of a portion of the first semiconductor layer 11 other than the first portion p1. For example, the resistance of the second portion p2 is higher than the resistance of a portion of the second semiconductor layer 12 other than the second portion p2. For example, the resistance of the third portion p3 is higher than the resistance of a portion of the light-emitting layer 13 other than the third portion p3.

The first to third portions p1 to p3 correspond to portions of the semiconductor stacked body 15 including the side surface. Because high resistances are obtained in the first to third portions p1 to p3, for example, leakage via the side surface of the semiconductor stacked body 15 can be suppressed. For example, the instability of the operations caused by the leakage can be suppressed. For example, a method for manufacturing a light-emitting element can be provided in which the characteristics are stabilized.

Figure 2B:
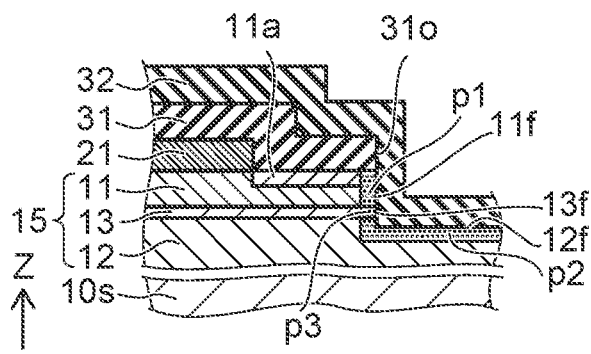
FIG. 2B is a schematic cross-sectional view illustrating a method for manufacturing a light-emitting element according to an embodiment.

As shown in FIG. 2B, a second layer 32 that is made of an insulating material may be formed after the processing process recited above (a second layer formation process).

The second layer 32 covers the first layer 31, the first portion p1 recited above including the first surface $11f$, the second portion p2 recited above including the second surface $12f$, and the third portion p3 recited above including the third surface $13f$. Higher protection performance is obtained by providing the second layer 32.

Further, a second electrode may be formed by the following method.

Figure 2C:
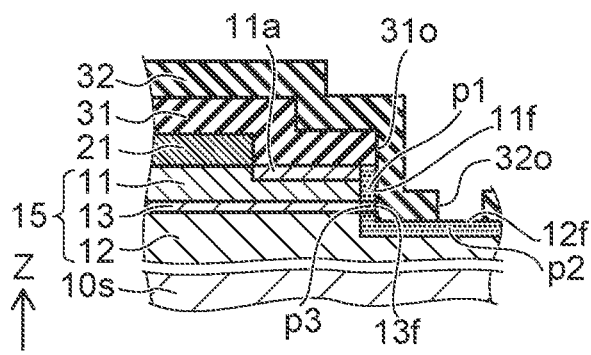
FIG. 2C is a schematic cross-sectional view illustrating a method for manufacturing a light-emitting element according to an embodiment.

As shown in FIG. 2C, a portion of the second layer 32 is removed after the second layer formation process. A second opening $32o$ is formed in the second layer 32. A portion of the second semiconductor layer 12 is exposed in the second opening $32o$.

Figure 2D:
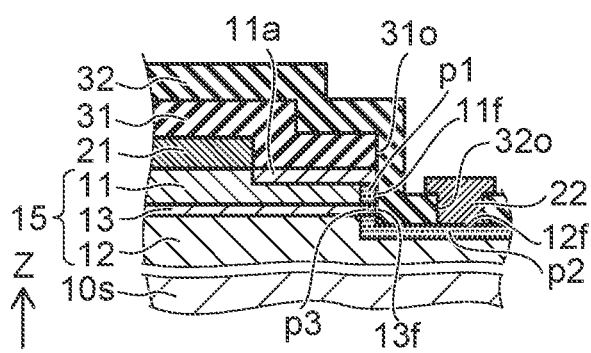
FIG. 2D is a schematic cross-sectional view illustrating a method for manufacturing a light-emitting element according to an embodiment.

As shown in FIG. 2D, a second electrode 22 is formed on an exposed portion of the second semiconductor layer 12 (a second electrode formation process). Thus, the manufacturing method according to the embodiment may further include the second electrode formation process of forming the second electrode 22 at a portion of the second semiconductor layer 12 exposed by removing a portion of the second layer 32.

The light-emitting element is obtained by the method recited above. According to the light-emitting element, a high resistance is obtained at the first to third portions p1 to p3 recited above (the side surface of the semiconductor stacked body 15). The leakage via the side surface of the semiconductor stacked body 15 can be suppressed. For example, a light-emitting element can be provided in which the characteristics are stabilized.

There are cases where the drive voltage of the light-emitting element fluctuates. It is considered that there are cases where a leakage current occurs at the side surface of the semiconductor stacked body 15, and the drive voltage fluctuates due to the leakage current.

For example, when forming the first layer 31 in the process illustrated in FIG. 1B, there are cases where the resistance of an interface portion 11a between the first semiconductor layer 11 and the first layer 31 becomes low. The resistance of the interface portion 11a is lower than the resistance of the other portions. Subsequently, the first to third surfaces $11f$ to $13f$ are formed by removing a portion of the semiconductor stacked body 15 in the process illustrated in FIG. 1D. At this time, the interface portion 11a that has the low resistance remains. Subsequently, if the processes of FIG. 2B and FIG. 2C are performed without performing the processing illustrated in FIG. 2A, the interface portion 11a that has the low resistance exists at the side surface of the semiconductor stacked body 15. Therefore, a leakage current is generated easily via the interface portion 11a having the low resistance. It is considered that fluctuation of the drive voltage occurs thereby.

Conversely, in the embodiment, the processing illustrated in FIG. 2A is performed in the atmosphere 81 including oxygen. Thereby, the resistance of the first portion p1 including the first surface $11f$ increases. Thereby, the leakage current is suppressed. Further, the resistances of the second portion p2 including the second surface $12f$ and the third portion p3 including the third surface $13f$ also are increased by the processing in the atmosphere 81 including oxygen. Thereby, the leakage current can be suppressed further. As a result, the fluctuation of the drive voltage can be suppressed. According to the embodiment, a method for manufacturing a light-emitting element can be provided in which the characteristics can be stabilized.

The processing of the atmosphere 81 including oxygen also may be performed on the outer perimeter portion of the semiconductor stacked body 15 in addition to the portion where the portion of the semiconductor stacked body 15 is removed (the portion exposed in the first opening 310 illustrated in FIG. 1D). Thereby, the leakage current at the outer perimeter portion of the semiconductor stacked body 15 also can be reduced.

In the case where SiN is used as the first layer 31, the resistance does not decrease easily at the interface portion 11a of the first semiconductor layer 11 on the first layer 31 side (referring to FIG. 1D), and the leakage current is relatively small. However, for SiN, the light extraction efficiency decreases easily because the light absorption is large.

On the other hand, it is considered that the light absorption is small in the case where $SiO_2$ is used as the first layer 31. However, in such a case, it was found that the resistance decreases easily at the interface portion 11a (referring to FIG. 1B). It is considered that when a $SiO_2$ layer is formed by CVD, etc., an incomplete oxide layer is formed at the interface between the first semiconductor layer 11 and the $SiO_2$ layer, and the resistance decreases due to dangling bonds in the incomplete oxide layer.

In such a case, in the embodiment, even when the interface portion 11a that has the low resistance is formed by performing the processing in the atmosphere 81 including oxygen, the resistance of the surface can be increased, and the leakage current can be reduced. Thereby, even in the case where $SiO_2$, which has low light absorption, is used as the first layer 31, the leakage current can be reduced, and stable characteristics can be obtained. Also, a high light extraction efficiency is obtained.

For example, it is favorable for the processing in the atmosphere 81 including oxygen illustrated in FIG. 2A to be performed in a state in which the electrodes (the first electrode 21, etc.) are covered with the first layer 31. The electrodes are oxidized if the processing in the atmosphere 81 including oxygen is performed also on the electrodes. For example, silver oxide is formed in the case where the electrodes include silver. Therefore, the desired conduction state is difficult to obtain. The desired conduction characteristics can be maintained by performing the processing in the atmosphere 81 including oxygen in the state in which the electrodes (the first electrode 21, etc.) are covered with the first layer 31.

In one example of the embodiment, the first layer 31 includes silicon and oxygen. In one example, the first layer 31 includes, for example, $SiO_2$. Thereby, the light absorption can be suppressed, and a high light extraction efficiency is obtained. In one example of the embodiment, the second layer 32 includes, for example, silicon and oxygen. The second layer 32 includes, for example, $SiO_2$. Thereby, the light absorption can be suppressed, and a high light extraction efficiency is obtained. A high insulative property is obtained, and high reliability is obtained. In one example, the first layer 31 includes, for example, SiON. Thereby, the light absorption can be suppressed, and a high light extraction efficiency is obtained. Also, the moisture resistance is excellent, and high reliability is obtained. The second layer 32 includes, for example, SiON. Thereby, the light absorption can be suppressed, and a high light extraction efficiency is obtained. Also, the moisture resistance is excellent, and high reliability is obtained.

In the embodiment, oxygen is introduced to a portion of the semiconductor stacked body 15 (the first to third portions p1 to p3) by the processing in the atmosphere 81 including oxygen. For example, the concentration of oxygen of the first portion p1 is higher than the concentration of oxygen of a portion of the first semiconductor layer 11 other than the first portion p1. For example, the concentration of oxygen of the second portion p2 is higher than the concentration of oxygen of a portion of the second semiconductor layer 12 other than the second portion p2. For example, the concentration of oxygen of the third portion p3 is higher than the concentration of oxygen of a portion of the light-emitting layer 13 other than the third portion p3.

In the removal of the portion of the semiconductor stacked body 15 illustrated in FIG. 1D, for example, dry etching (RIE or the like) that uses a chlorine-based gas is performed.

The manufacturing method according to the embodiment may include forming the first electrode 21 (a first electrode formation process). In the first electrode formation process, the first electrode 21 is formed between the preparation process and the first layer formation process. The first electrode 21 is provided at a portion of the first semiconductor layer 11. The first layer 31 covers the first electrode 21 and a region of the first semiconductor layer 11 not covered with the first electrode 21.

For example, the film that is used to form the first electrode 21 can be formed by a method such as sputtering, etc. Film formation that uses a mask may be performed. After forming the film used to form the first electrode 21, a portion of the film may be removed.

In the embodiment, the first electrode 21 includes at least one selected from the group consisting of Ag, Al, Ni, Ti, Ta, Pt, and Ru. The second electrode 22 includes at least one selected from the group consisting of Ag, Al, Ni, Ti, Pt, Rh, Au, and Ru.

The semiconductor stacked body 15 includes, for example, a nitride semiconductor. The nitride semiconductor includes, for example, $In_X Al_Y Ga_{1-X-Y} N$ ($0 \leq X$, $0 \leq Y$, and $X+Y<1$). The first semiconductor layer 11 includes, for example, Mg as an impurity. The second semiconductor layer 12 includes, for example, Si as an impurity.

An example of the light-emitting element according to the embodiment will now be described.

Figure 3:
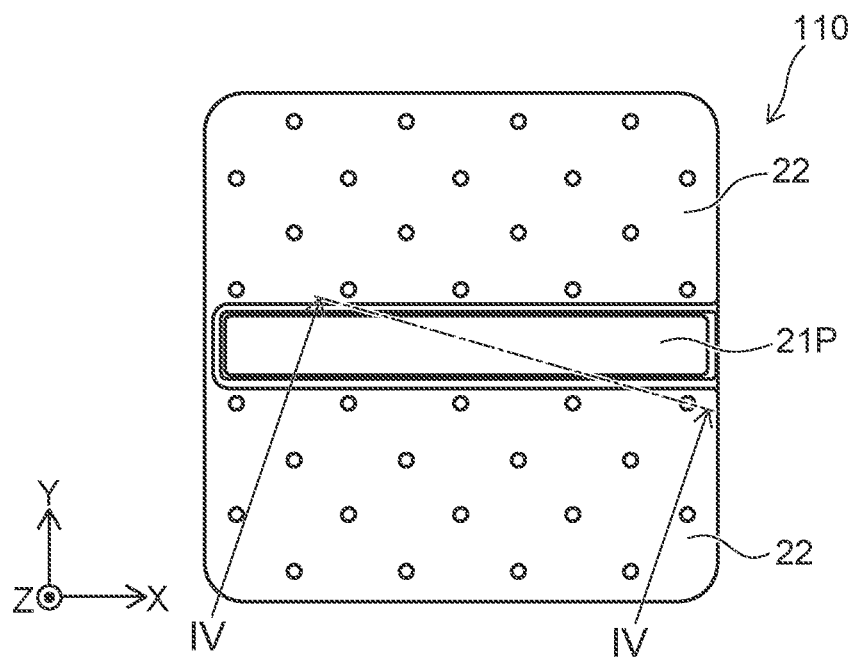
FIG. 3 is a schematic plan view illustrating the light-emitting element according to the embodiment.

FIG. 3 is a schematic plan view illustrating the light-emitting element according to the embodiment.

Figure 4:
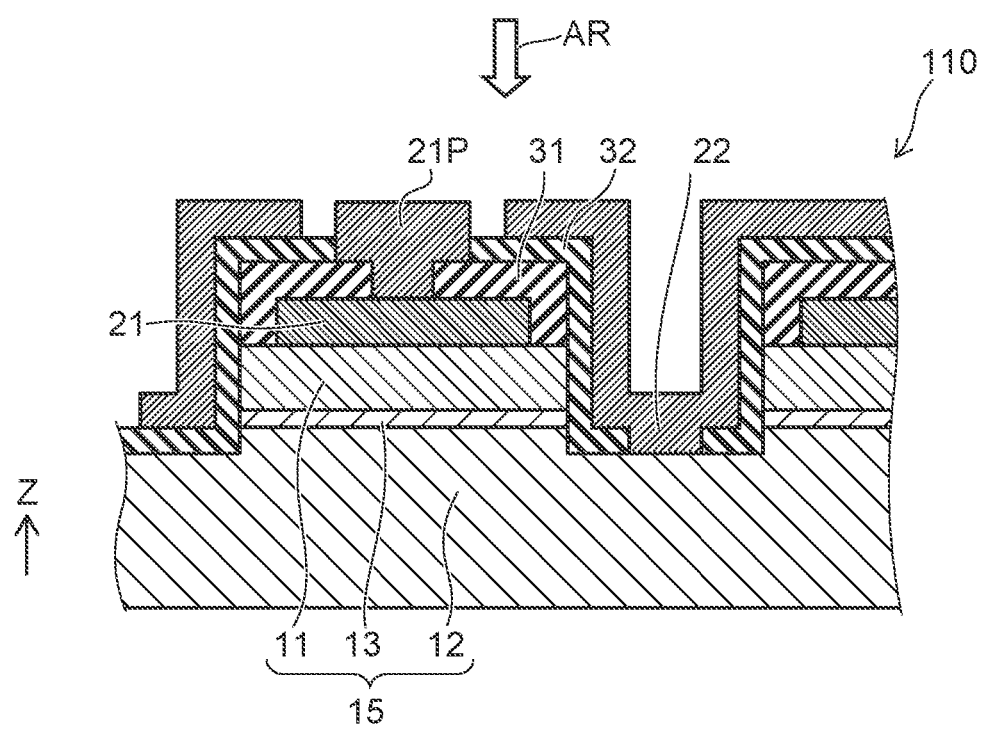
FIG. 4 is a schematic cross-sectional view illustrating the light-emitting element according to the embodiment.

FIG. 4 is a schematic cross-sectional view illustrating the light-emitting element according to the embodiment.

FIG. 3 is a plan view as viewed along arrow AR of FIG. 4. FIG. 4 is a line IV-IV cross-sectional view of FIG. 3. As shown in FIG. 3 and FIG. 4, the light-emitting element 110 includes the semiconductor stacked body 15 (the first semiconductor layer 11, the second semiconductor layer 12, and the light-emitting layer 13), the first electrode 21, the second electrode 22, the first layer 31, and the second layer 32. The first electrode 21 is electrically connected to the first semiconductor layer 11. The second electrode 22 is electrically connected to the second semiconductor layer 12.

One direction perpendicular to the Z-axis direction is taken as an X-axis direction. A direction perpendicular to the Z-axis direction and the X-axis direction is taken as a Y-axis direction. The thickness (e.g., the length along the Z-axis direction) of the light-emitting element 110 is, for example, not less than 50 μm and not more than 5000 μm. The thickness of the light-emitting element 110 is, for example, 150 μm. The length (e.g., the length along the X-axis direction or the Y-axis direction) of one side of the light-emitting element 110 is, for example, not less than 500 μm and not more than 2000 μm.

A first pad layer 21P is provided in the example. The first electrode 21 is provided between the first pad layer 21P and the first semiconductor layer 11 in the Z-axis direction. The first pad layer 21P is electrically connected to the first electrode 21. A portion of the first layer 31 is provided between a portion of the first pad layer 21P and a portion of the first electrode 21 in the Z-axis direction.

In the example, a portion of the second layer 32 is provided between the second semiconductor layer 12 and a portion of the second electrode 22 in the Z-axis direction. A portion of the first layer 31 and a portion of the second layer 32 are provided between the first semiconductor layer 11 and another portion of the second electrode 22 in the Z-axis direction.

The first electrode 21 includes, for example, a Ag film. The first pad layer 21P includes, for example, a stacked film of Ag/Ni/Ti/Pt. The second electrode 22 includes, for example, a stacked film of Ti/Pt/Au.

According to the embodiments, a method for manufacturing a light-emitting element can be provided in which the characteristics can be stabilized.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in methods for manufacturing light-emitting elements such as substrates, semiconductor stacked bodies, electrodes, layers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all methods for manufacturing light-emitting elements practicable by an appropriate design modification by one skilled in the art based on the methods for manufacturing light-emitting elements described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

What is claimed is:

1. A method for manufacturing a light-emitting element, the method comprising:
    a preparation process comprising preparing a semiconductor stacked body that comprises a first semiconductor layer, a second semiconductor layer, and a light-emitting layer located between the first semiconductor layer and the second semiconductor layer, the first semiconductor layer comprising a semiconductor of a first conductivity type, the second semiconductor layer comprising a semiconductor of a second conductivity type;
    a first layer formation process comprising forming a first layer on the first semiconductor layer, the first layer being made of an insulating material;
    a removal process comprising removing a part of the first layer, a part of the first semiconductor layer, a part of the light-emitting layer, and a part of the second semiconductor layer;
    a processing process comprising introducing oxygen into (i) a portion of the first semiconductor layer that includes a first surface formed in the removal process, (ii) portion of the second semiconductor layer that includes a second surface formed in the removal process, and (iii) a portion of the light-emitting layer that includes a third surface formed in the removal process, the introducing being performed by, after the removal process, processing the semiconductor stacked body in an atmosphere including oxygen;
    after the processing process, a second layer formation process comprising forming a second layer made of an insulating material, the second layer covering the first layer, the portion of the first semiconductor layer that includes the first surface, the portion of the second semiconductor layer that includes the second surface, and the portion of the light-emitting layer that includes the third surface; and
    after the second layer formation process, a second electrode formation process comprising:
        removing a part of the second layer such that a first part of said portion of the second semiconductor layer is exposed from the second layer and a second part of said portion of the second semiconductor layer remains covered by the second layer, and
        forming a second electrode at the first part of said portion of the second semiconductor layer.

2. The method according to claim 1, wherein the second layer comprises silicon and oxygen.

3. The method according to claim 1, wherein the first layer comprises silicon and oxygen.

4. The method according to claim 1, further comprising:
    between the preparation process and the first layer formation process, a first electrode formation process comprising forming a first electrode at a portion of the first semiconductor layer;
    wherein, in first layer formation process, the first layer is formed to cover the first electrode and a region of the first semiconductor layer not covered with the first electrode.

5. The method according to claim 4, wherein the first electrode comprises at least one selected from the group consisting of Ag, Al, Ni, Ti, Ta, Pt, and Ru.

6. The method according to claim 1, wherein the processing process comprises processing using oxygen plasma.

7. The method according to claim 1, wherein the removal process comprises etching using a mask.

8. The method according to claim 1, wherein the processing process further comprises introducing oxygen to an outer perimeter portion of the semiconductor stacked body.

9. The method according to claim 1, wherein the first layer comprises $SiO_2$.

10. The method according to claim 1, wherein the first layer comprises SiON.

11. The method according to claim 1, wherein the second layer comprises $SiO_2$.

12. The method according to claim 1, wherein the second layer comprises SiON.

13. The method according to claim 1, wherein the processing process causes a concentration of oxygen of the portion of the first semiconductor layer that includes the first surface to be higher than a concentration of oxygen of a portion of the first semiconductor layer other than the portion that includes the first surface.

14. The method according to claim 1, wherein:
    the processing process causes a concentration of oxygen of the portion of the second semiconductor layer that includes the second surface to be higher than a concentration of oxygen of a portion of the second semiconductor layer other than the portion that includes the second surface; and the processing process causes a concentration of oxygen of the portion of the light-emitting layer that includes the third surface to be higher than a concentration of oxygen of a portion of the light-emitting layer other than the portion that includes the third surface.

15. The method according to claim 1, wherein the removal process comprises dry etching using a chlorine-based gas.

16. The method according to claim 1, wherein the second electrode comprises at least one selected from the group consisting of Ag, Al, Ni, Ti, Pt, Rh, Au, and Ru.

17. The method according to claim 1, wherein the semiconductor stacked body comprises a nitride semiconductor.

18. The method according to claim 1, wherein a portion of the second layer is covered by the second electrode.

* * * * *